United States Patent
Bchir et al.

(10) Patent No.: US 8,252,677 B2
(45) Date of Patent: Aug. 28, 2012

(54) METHOD OF FORMING SOLDER BUMPS ON SUBSTRATES

(75) Inventors: Omar Bchir, Phoenix, AZ (US); Ravi Nalla, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 11/863,935

(22) Filed: Sep. 28, 2007

(65) Prior Publication Data

US 2009/0085206 A1 Apr. 2, 2009

(51) Int. Cl.
*H01L 21/44* (2006.01)
*H01L 23/48* (2006.01)

(52) U.S. Cl. ........ 438/612; 438/613; 438/614; 438/615; 257/737; 257/738; 257/778; 257/E21.058; 257/E21.059; 257/E23.023; 257/E23.069

(58) Field of Classification Search .................. 438/612, 438/613, 614, 615; 257/737, 738, 778, E21.058, 257/E21.059, E23.023, E23.069

See application file for complete search history.

(56) References Cited

U.S. PATENT DOCUMENTS

| | | | | |
|---|---|---|---|---|
| 6,137,690 A | * | 10/2000 | Carson et al. | 361/779 |
| 7,122,894 B2 | * | 10/2006 | Sugimoto et al. | 257/737 |
| 7,132,020 B2 | * | 11/2006 | Nozawa et al. | 148/400 |
| 7,338,567 B2 | * | 3/2008 | Munekata et al. | 148/400 |
| 2003/0029908 A1 | * | 2/2003 | Suzuki et al. | 228/180.22 |
| 2004/0069840 A1 | * | 4/2004 | Mackay | 228/248.1 |

* cited by examiner

*Primary Examiner* — Dao H Nguyen

(74) *Attorney, Agent, or Firm* — Grossman, Tucker, Perreault & Pfleger, PLLC

(57) ABSTRACT

A method of forming solder bumps on a substrate is disclosed. The method includes forming a plurality of contact points on the substrate. The method further includes depositing a layer of surface finish material on the plurality of contact points. Furthermore, the method includes disposing a plurality of solder balls on the layer of surface finish material. Each solder ball of the plurality of solder balls has conductive material including a solder alloy and Phosphorus. Thereafter, the method includes applying a solder reflow process to the plurality of solder balls to configure a plurality of solder bumps on the substrate layer. The concentration of the Phosphorus in the solder material is based on target performance characteristic of the substrate having the plurality of solder bumps.

5 Claims, 5 Drawing Sheets

METHOD OF FORMING SOLDER BUMPS ON SUBSTRATES

FIELD

The present disclosure generally relates to microelectronic devices, and, more particularly, to a method of forming solder bumps on substrates of microelectronic devices.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference has to be made to the following detailed description, including the appended claims, in connection with the above-described drawings. Although the present disclosure is described in connection with exemplary embodiments, the present disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "a" and "an" herein do not denote a limitation of quantity, but rather denote the presence of at least one of the referenced item.

The present disclosure provides a method of forming solder bumps on a substrate. The present disclosure provides an option of varying a concentration of Phosphorus (P) in the solder bumps in order to improve performance of the substrate having such solder bumps. Further, the present disclosure is capable of achieving an improved control of a height variation of the solder bumps and of void formation in the solder bumps.

Figure 1A:
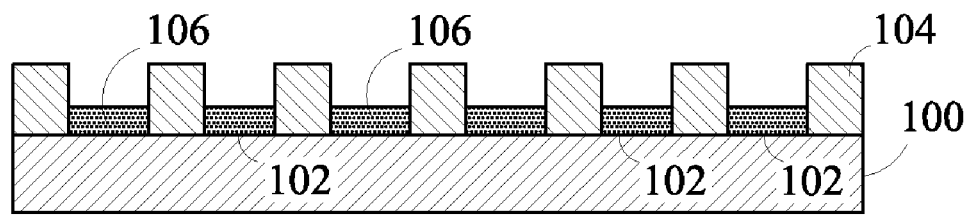
FIGS. 1A through 1E illustrate various stages in forming solder bumps on a substrate, according to an exemplary embodiment of the present disclosure.

FIGS. 1A through 1E illustrate various stages in forming solder bumps on a substrate 100, according to an exemplary embodiment of the present disclosure. A first stage of forming the solder bumps on the substrate 100 is illustrated in FIG. 1A. The substrate 100 may have patterns comprising, but not limited to, conductive traces, vias or patterns specific to electronic circuits to be formed on the substrate 100. The first stage of forming the solder bumps comprises forming a plurality of contact points 102 on the substrate 100. Preferably, the contact points 102 on the substrate are conductive pads. Alternatively, the contact point 102 may also be vias, any metal pad, an electrode and a portion of the conductive traces or a portion of the patterns specific to the electronic circuits to be formed on the substrate 100. The contact points 102 may be used to provide electrical connectivity to the patterns at the substrate 100 to the components that are external to the substrate 100 through the solder bumps formed thereon. Suitable materials used for the contact points 102 include, but are not limited to, copper (Cu) and aluminum (Al).

In one embodiment of the present disclosure, a passivation layer 104 may be formed around the contact points 102 to isolate the contact points 102 from each other. The passivation layer 104 may be composed of any insulating material. The first stage of forming the solder bumps on the substrate 100 further comprises depositing a layer of surface finish material 106 (hereinafter referred to as 'layer 106') over the contact points 102. The layer 106 may comprise metals such as, but not limited to, electroless Nickel (Ni) and Gold (Au). The electroless Ni may be deposited by using an acidic hypophosphite bath. Further, the layer 106 may also be rich in phosphorus. The layer 106 serves the purpose of providing good wetting and bonding characteristics to the contact points 102 of the substrate 100, as well as electromigration resistance.

Figure 1B:
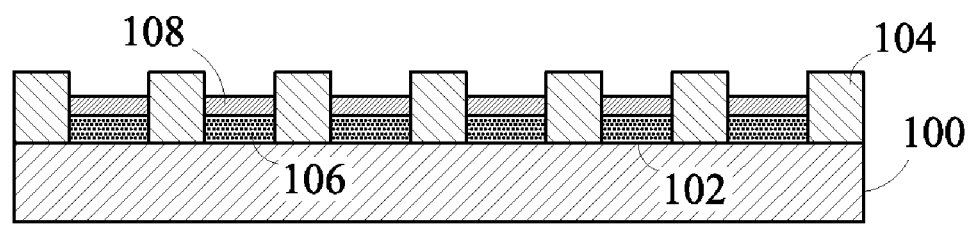

In an optional second stage of forming the solder bumps on the substrate 100, a layer of flux material 108 (hereinafter referred to as 'layer 108') is deposited on the layer 106, which is over the contact points 102, as illustrated in FIG. 1B. The flux can be dispensed by a variety of means, including but not limited to printing through a stencil mask, spraying etc. The layer 108 serves to prevent oxidation of the layer 106, while also serving to chemically clean material layers to be joined around the layer 108. The layer 108 may also serve to anchor subsequently placed solder balls. However, in another embodiment of the present disclosure, the layer 108 is not necessarily required to be deposited over the layer 106 in the stages of forming the solder bumps on the substrate 100.

Figure 1C:
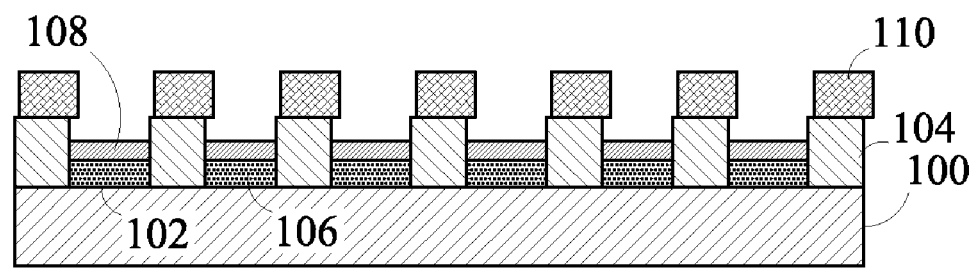

In a third stage of forming the solder bumps on the substrate 100, a ball mounting mask 110 is placed on the substrate 100, as illustrated in FIG. 1C. The mask 110 comprises a plurality of openings. The mask 110 is placed on the substrate 100 such that the plurality of openings of the mask 110 is aligned with regions of the contact points 102 in the substrate 100.

Figure 1D:
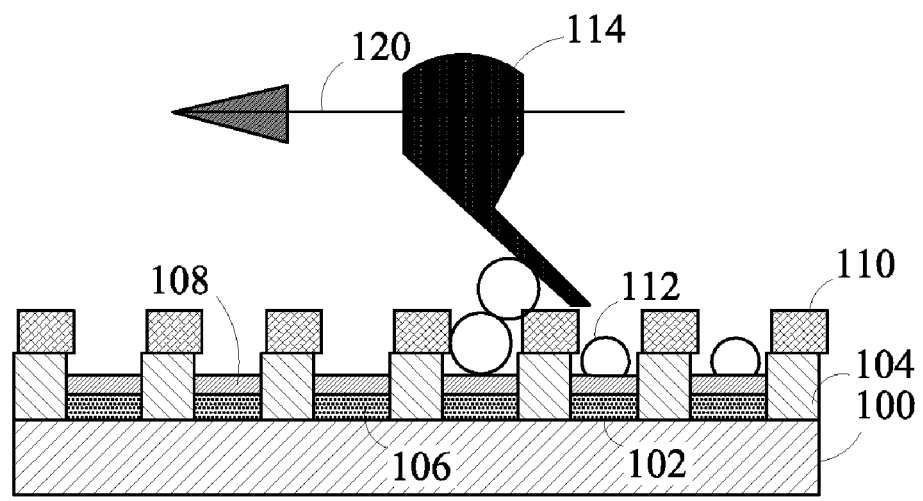

Further, in a fourth stage of forming the solder bumps on the substrate 100, a plurality of solder balls 112 is disposed on the regions of the contact points 102 in the substrate 100, as shown in FIG. 1D. For disposing the solder balls 112 on the layer 108, which is in the region of contact points 102, the solder balls 112 are dispersed on the solder mask 110. Further, a squeegee brush 114 is moved along a rectilinear path, represented by a direction arrow 120 in the FIG. 1D, to dispose the solder balls 112 on the regions of the contact points 102. The solder balls 112 are disposed on the layer on the region of the contact points 102 through the plurality of openings in the solder mask 110. Alternatively, a brush, moving in circular paths, may be used.

The solder balls 112 comprise a solder material formed by thermo-mechanical blending of a mixture of a solder alloy and phosphorus (P). The mixing of the solder alloy and Phosphorus in the solder balls 112 may be achieved by blending phosphorus with the solder alloy during manufacturing of the solder alloy. For example, a solder alloy comprising Tin (Sn) powder (96.5 wt. %) and Silver (Ag) powder (3.5 wt. %) is blended with phosphorus (1000 Parts Per Million (PPM) level) by applying a thermo-mechanical blending to form a P-doped Sn-3.5 Ag alloy. Thereafter, the solder balls 112 may be prepared from the P-doped Sn-3.5 Ag alloy. Alternatively, a solder alloy comprising Sn powder (96 wt %), Ag (3 wt %) and Cu (0.5 wt %) may be blended with phosphorus to form a P-doped Sn-3Ag-0.5Cu alloy. Alternatively, other lead-based and lead-free alloys may also be used.

Figure 1E:
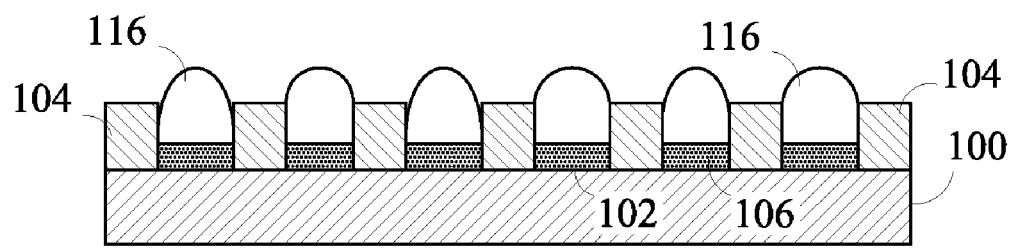

In a final stage of forming the solder bumps on the substrate 100, a solder reflow process is applied at the substrate 100, as shown in FIG. 1E. As a result of the solder reflow process, the solder balls 112 melt to form a plurality of solder bumps 116 on the layer 106. The layer 108 also gets melted during the solder reflow process. During the solder reflow process, a portion of the layer 106 may dissolve in the solder material of the solder balls 112 to form an Inter Metallic Compound (IMC) layer (not shown). More specifically, when the layer 106, which is rich in Ni and phosphorus (P) mixes with the solder balls 112, which are rich in Sn, the IMC layer is formed during the solder reflow process. An IMC layer richer in P has been shown to provide improved maximum current carrying capability for a solder joint.

The IMC layer may form a solid metallurgical bonding between the layer 106 and the solder bumps 116. Hence, the IMC layer may act as a 'solder joint' between a solder bump 116 and the layer 106. Further, a good metallurgical bonding is formed between the contact points 102 and the solder bumps 116 as the layer 106 is deposited over the contact points 102. The IMC layer can modulate Ni diffusion from layer 106 into the solder bumps 116. In general, reducing Ni diffusion from layer 106 may improve the electromigration life of the solder joint in the substrate 100. As a result of good metallurgical bonding provided by the IMC layer, an increase in a maximum current carrying capability of the substrate 100 is achieved. More specifically, the maximum current carrying capability is a measure of a current carrying capability through the contact points 102, the layer 106, and the IMC layer between the layer 106 and the solder bumps 116. The value of maximum current carrying capability depends upon the parameters of the solder joints, i.e., parameters of the IMC layer. In other words, the value of the maximum current carrying capability can depend in part upon the quality of the IMC layer.

The variation of maximum current carrying capability performance of a substrate is believed to be related to the quality of the IMC layer at the solder to substrate interface.

Superior maximum current carrying capability performance may be obtained for IMC layers which are rich in P. Therefore, control of the composition and quality of the IMC layer may be done to improve the maximum current carrying capability of the substrates.

The present disclosure provides an approach of varying a concentration of phosphorus in the solder material of the solder balls 112, which may obtain a desired IMC layer composition and quality and in turn a desired maximum current carrying capability. The maximum current carrying capability may be termed as a target performance characteristic of the solder joints of the solder bumps 116 on the layer 106. The concentration of phosphorus may be varied to obtain a desired IMC composition and quality, which will enable improvement of the target performance characteristics. For example, phosphorus may be present in an amount of about 50 PPM for doped Ball Grid Array (BGA) solder balls and this may be a starting range for the concentration of phosphorus in the solder balls 110. On the other hand, concentration of phosphorus may be refined (at less than or equal to about 1000 PPM) based on quality of IMC layer formed and the resulting maximum current carrying capability. This technique can be used with most lead-based and lead-free solder alloys.

The present disclosure provides an IMC layer between the solder bumps 116 and the layer 106 in the substrate 100. The IMC layer of the substrate 100 may provide an improved maximum current carrying capability to the substrate 100. A higher concentration of phosphorus in the solder material of the solder balls 112 may result in an improved IMC composition and quality. Further, the increase in concentration of phosphorus in the solder material also improves the reliability of solder joints formed between the solder bumps 116 and the layer 106.

Figure 2A:
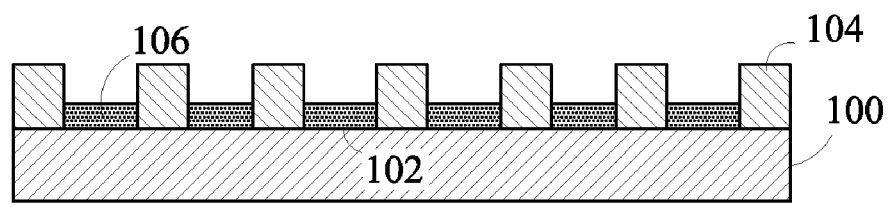
FIGS. 2A through 2E illustrate various stages in forming solder bumps on a substrate, according to another exemplary embodiment of the present disclosure.
Figure 2B:
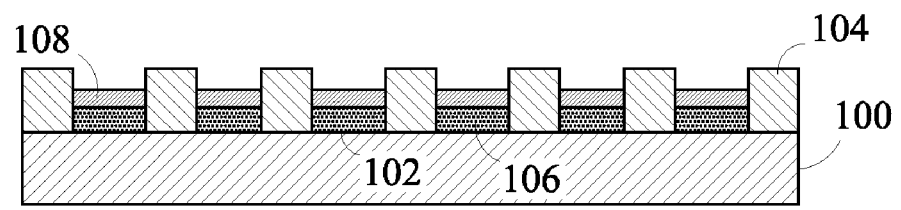

FIGS. 2A through 2E illustrate various stages in forming the solder bumps 116 on the substrate 100, according to another exemplary embodiment of the present disclosure. This embodiment of the present disclosure differs from the previously described embodiment (FIGS. 1A through 1E) in terms of only a method utilized for disposing the solder balls 112 on the substrate 100. Therefore, the first and second stage of the present embodiment is similar to that of the previously described embodiment. For example, the first stage of this embodiment provides a substrate 100 with the contacts points 102 disposed thereon, as shown in FIG. 2A. Further the passivation layer 104 is provided around the contact points 102 followed by deposition of the layer 106 of the surface finish materials similar to the FIG. 1A. Further, in an optional second stage of the forming of the solder bumps 116 on the substrate 100, the layer 108 of flux material is deposited on the layer 106, as shown in FIG. 2B, which is similar to the FIG. 1B.

Figure 2C:
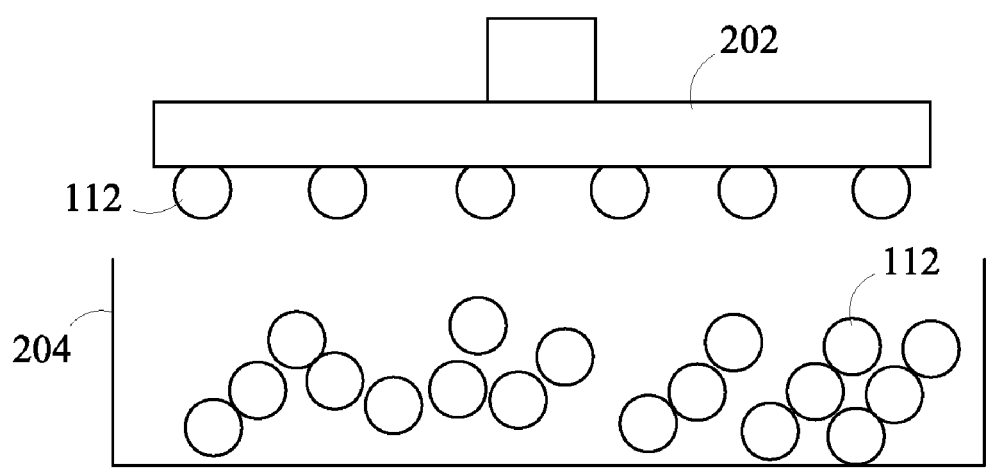
Figure 2D:
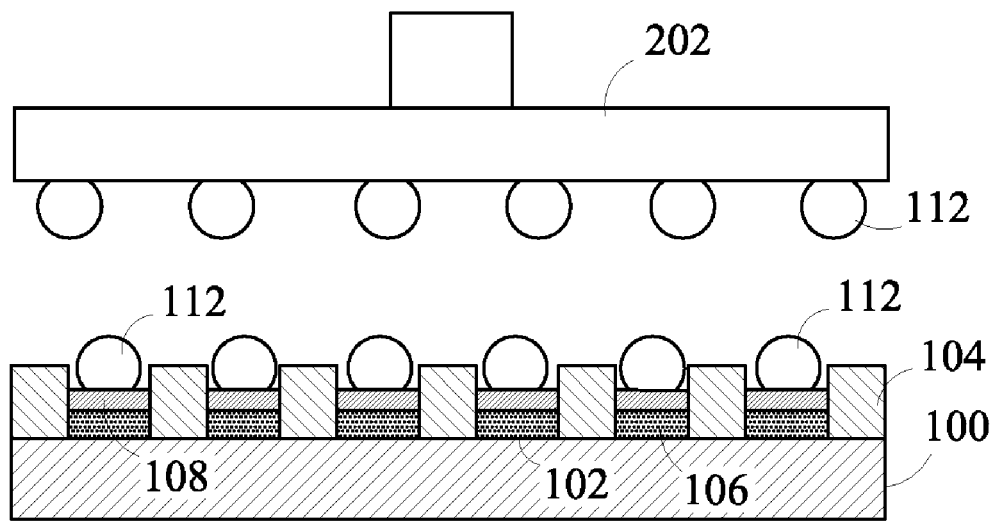
Figure 2E:
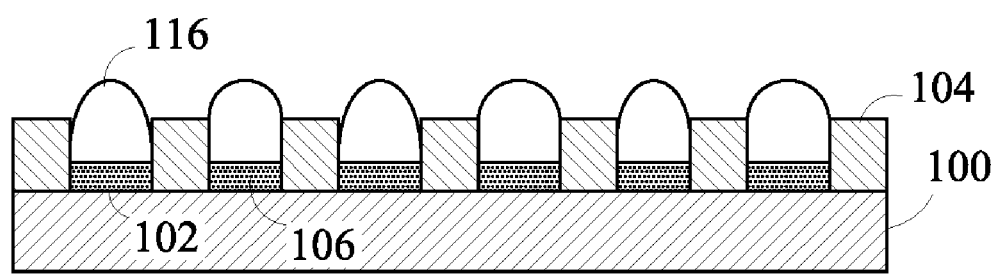

In a third stage of this embodiment of the present disclosure, a vacuum head 202 picks solder balls 112 from a container 204 using a vacuum, as shown in FIG. 2C. The solder balls 112 are aspirated by the vacuum head 202 and, subsequently, the solder balls 112 stick thereupon. In a fourth stage of this embodiment, the vacuum head 202 is aligned over the substrate 100, as shown in FIG. 2D. The vacuum in the vacuum head 202 is turned off to release the solder balls 112 on to the layer 108. The solder balls 112 stick above the contact points 102 due to the layer 108 and the layer 106, which are deposited over the contact points 102. In a final stage, a solder reflow process is applied to the substrate 100, as illustrated in FIG. 2E which is similar to that of the FIG. 1E to configure the solder bumps 116 on the substrate 100.

The present disclosure is not limited to use of squeegee brush 114 or the vacuum head 202 for disposing the solder balls 112 on the substrate 100. It will be obvious to a person skilled in the art that other methods, apart from those discussed above, may also be utilized for disposing the solder ball 112 on the region of the contact points 102 at the substrate 100.

Various embodiments of the present disclosure offer following advantages. The present disclosure describes use of solder balls 112 in which a concentration of phosphorus may be varied to obtain desired performance characteristic of the substrate on which the solder balls 112 may be disposed to form the solder bumps 116. For example, the solder balls 112 are useful in a Controlled Collapse Chip Connection (C4) solder bumping technology. Such solder balls 112 result in a formation of the IMC layer during the solder reflow process. Therefore, the IMC layer can modulate the diffusion of the Ni of the layer 106 into the solder bumps 116. As a result of reduced diffusion, the substrate 100 has an improved maximum current carrying capability.

Additionally, the present disclosure provides improved techniques for the formation of the solder bumps 116, as described in conjunction with FIGS. 1D and 2D, than the convention stencil mask printing technology. Further, the present disclosure provides a better control over a height variation of the solder bumps 116. The advantage of the control over a height variation of the solder bumps 116 is described further in conjunction with FIGS. 3A and 3B, of the present disclosure.

Figure 3A:
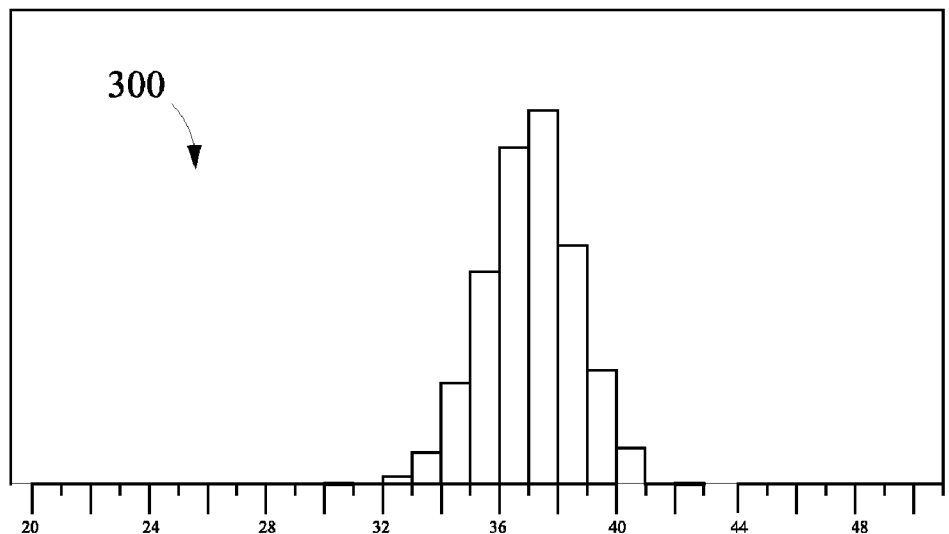
FIG. 3A is a bar graph of height profile of solder bumps on a substrate, according to an exemplary embodiment of the present disclosure.
Figure 3B:
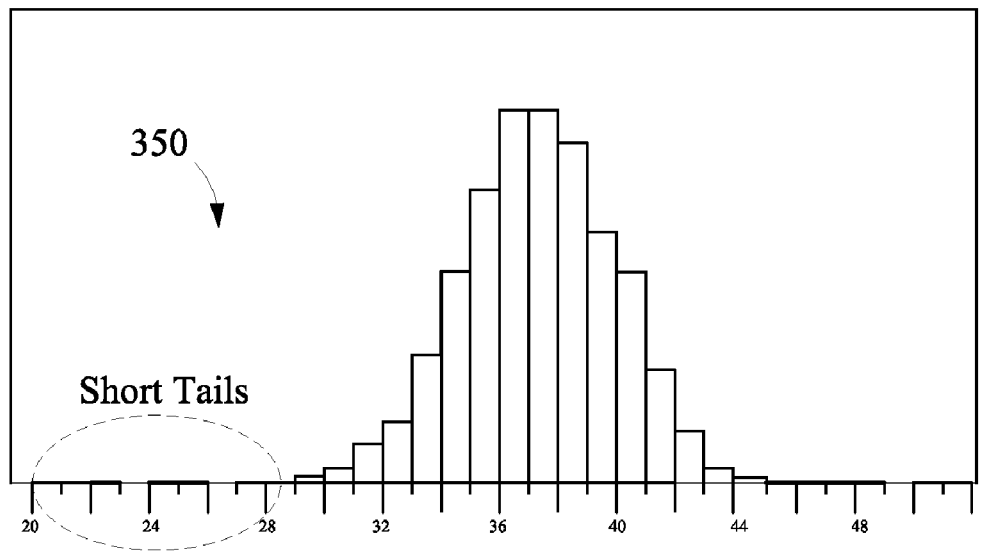
FIG. 3B is a bar graph of height profile of solder bumps on a substrate according to a conventional technique.

FIGS. 3A and 3B illustrate a bar graph 300 and a bar graph 350 respectively. The bar graph 300 (hereinafter referred to as 'graph 300') plots height profile for the solder bump 116 of the substrate 100 and the bar graph 350 (hereinafter referred to as 'graph 350') plots the height profile for the solder bump of a substrate utilizing a conventional solder bumping technique such as stencil mask based paste printing.

The graph 300 considers a sample set of solder bumps 116 formed on the substrate 100. Heights of the solder bumps 116 in the sample set are recorded in the bar graph 300 along with a corresponding number of the solder bumps 116. Similarly, the graph 350 records a relation between heights of the solder bumps in a sample set and a corresponding number of the solder bumps in the conventional solder bumping technique such as the stencil mask based printing.

It is evident that the graph 300 has a tighter span of height profile than the graph 350. More specifically, the height variation in the graph 300 is less that that in the graph 350. Further, the graph 300 does not have 'tails' in comparison to the graph 350 (marked by a dotted area in FIG. 3B). The tails are the solder bumps 116 having very short height. For example, the graph 300 does not have any solder bumps 116 with short height. Contrary to the above, the graph 350 includes solder bumps 116 with short height. Such short bumps may lead to problems during subsequent attachment to silicon die or other components.

Therefore, from the graphs 300 and 350, it is evident that the present disclosure describes a solder bumping technique that provides improved results over the conventional solder bumping techniques. Further, the use of solder balls 112 doped with phosphorus improves the reliability of the IMC layer formed during the solder reflow process, which may improve the reliability and current carrying capability of the substrate 100.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A method of forming solder bumps on a substrate, comprising:
    forming a plurality of contact points on the substrate;
    depositing a layer of a surface finish material over and directly in contact with the plurality of contact points, the surface finish material comprising nickel and phosphorous;
    depositing a layer of a flux material on the layer of the surface finish material;
    forming a ball mounting mask having a plurality of openings each aligned with a respective one of the contact points on the substrate;
    disposing a plurality of solder balls in direct contact with the layer of flux material, each solder ball of the plurality of solder balls having a solder material comprising a lead free solder alloy and phosphorus;
    applying a solder reflow process to the plurality of solder balls disposed on the layer of flux material to configure a plurality of solder bumps on the substrate;
    forming an inter metallic compound layer comprising at least a portion of the surface finish material dissolved in at least a portion of the solder material.

2. The method of claim 1, further comprising configuring a passivation layer around the plurality of contact points to isolate the plurality of contact points from each other.

3. The method of claim 1, wherein the concentration of the phosphorus in the solder material is approximately 50 parts per million (ppm) to about 1000 ppm.

4. The method of claim 1, wherein the plurality of solder balls are disposed on the layer of surface finish material by using a squeegee brush.

5. The method of claim 1, wherein the plurality of solder balls are disposed on the layer of surface finish material by using a vacuum head.

\* \* \* \* \*